United States Patent
Matsushita

(10) Patent No.: US 6,218,847 B1
(45) Date of Patent: Apr. 17, 2001

(54) TEST PATTERN FOR USE IN MEASURING THICKNESS OF INSULATING LAYER AND METHOD FOR USING THE SAME

(75) Inventor: Kinichi Matsushita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 08/977,882

(22) Filed: Nov. 25, 1997

(30) Foreign Application Priority Data

Jul. 4, 1997 (JP) ..................................... 9-180139

(51) Int. Cl.⁷ .............................. G01N 27/04; G01B 7/06
(52) U.S. Cl. .......................... 324/716; 324/699; 324/629
(58) Field of Search ................................... 324/716, 719, 324/766, 765, 693, 699, 629; 257/48, 438, 758

(56) References Cited

U.S. PATENT DOCUMENTS

| | | | | |
|---|---|---|---|---|
| 5,032,890 | * | 7/1991 | Ushiku et al. ........................ | 357/41 |
| 5,598,010 | * | 1/1997 | Uematsu ................................ | 257/48 |
| 5,652,465 | * | 7/1997 | Hosodo et al. ....................... | 257/758 |
| 5,930,672 | * | 7/1999 | Yamamoto ............................ | 438/637 |
| 6,020,264 | * | 2/2000 | Lustig et al. ......................... | 438/692 |

FOREIGN PATENT DOCUMENTS

49111 * 11/1991 (JP) ....................................... 257/48

OTHER PUBLICATIONS (Author and Title Unknown), Logic LSI Innovation, Science Forum Co., Ltd., 1995, pp. 265–269. (No Month Available).

* cited by examiner

Primary Examiner—Glenn W. Brown
(74) Attorney, Agent, or Firm—Jones Volentine, L.L.P

(57) ABSTRACT

A test pattern for use in measuring thickness of insulating layer comprising a wiring pattern provided in an insulating layer and a dummy pattern provided in the insulating layer. The wiring pattern has a electrical resistant value depending on the thickness of the insulating layer. The dummy pattern is provided so as to be adjacent to the wiring layer. The dummy pattern allows the thickness of the insulating layer thereon to be directly measured. By using the test pattern, characteristic chart showing a relationship between the electrical resistance value and the thickness of the insulating layer.

21 Claims, 5 Drawing Sheets

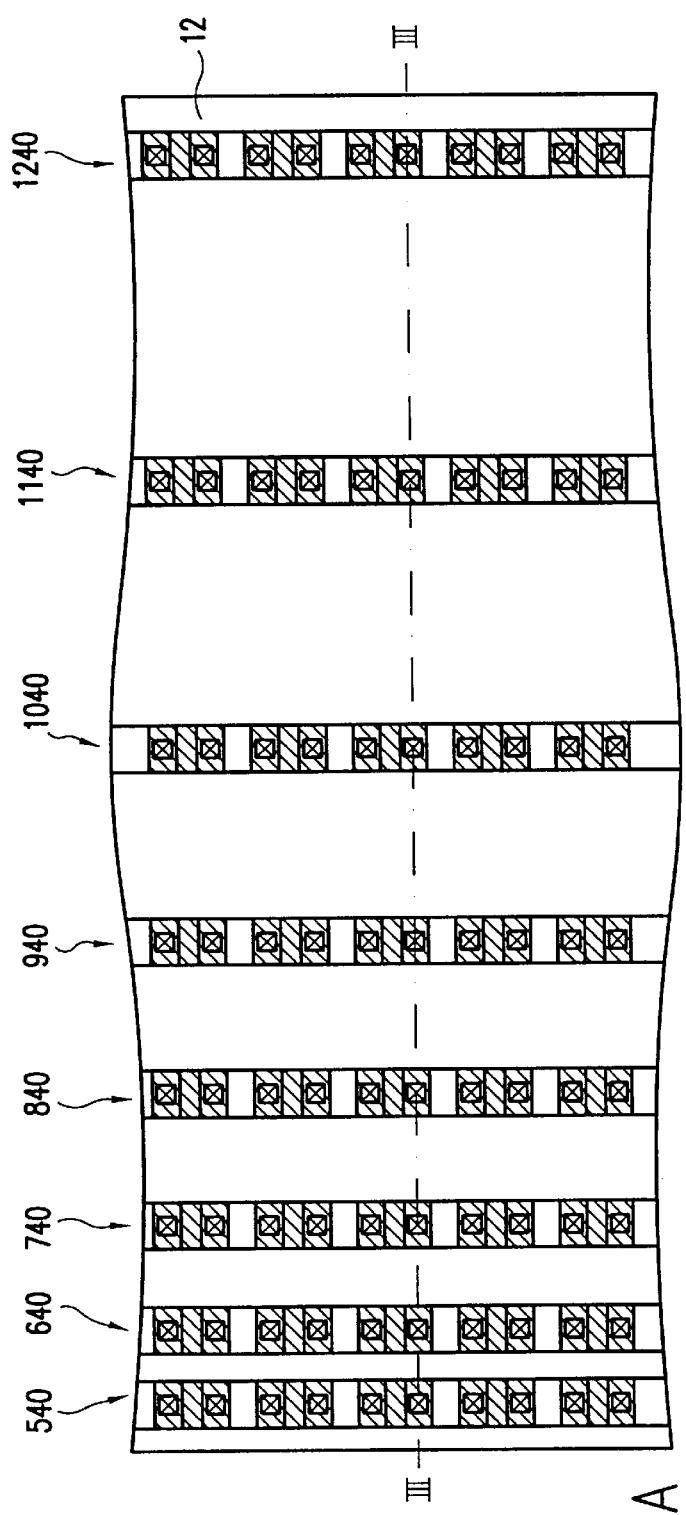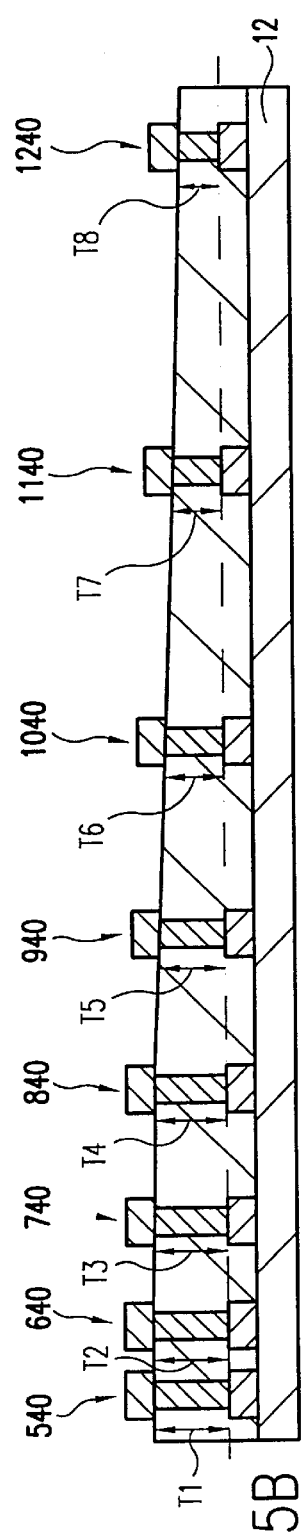
FIG.5A
FIG.5B

TEST PATTERN FOR USE IN MEASURING THICKNESS OF INSULATING LAYER AND METHOD FOR USING THE SAME

BACKGROUND OF THE INVENTION

1. Field of the Invention

The present invention relates to a test pattern for measuring the thickness of an insulating layer and a method for measuring a thickness of the insulating layer using the test pattern.

2. Description of the Related Art

It is often required to measure the thickness of an insulating layer form ed on wiring patterns of a semiconductor device.

It is known, in general, that the thickness of an insulating layer formed on wiring patterns varies between a region where wiring patterns are formed with high density and a region where only one wiring pattern is formed in an isolated manner after the planarization (Reference: *Logic LSI Innovation*, Science Forum Co. ltd., 1995, pp. 265–269). More specifically, it is known that the thickness of the insulating layer formed on wiring patterns arranged with high density is thicker than the insulating layer formed on an isolated wiring pattern, that is, a wiring pattern with low density. This is due to the difference in coating conditions of a coating layer (SOG layer) coated during flattening process.

Therefore, it is necessary to measure the thickness of an insulating layer which has been formed on wiring patterns and flattened by using planarization(flattering) technique, for example, when designing semiconductor device manufacturing process so as to know the uneven step coverage of a base.

As a method for measuring the thickness of an insulating layer formed on wiring patterns, there has been proposed a method using an optical measuring apparatus or using a capacitance measuring apparatus.

In the layer thickness measuring method by the optical measuring apparatus, light is applied to a target or an insulating layer to measure the layer thickness from the reflectance factor. In the method by the capacitance measuring apparatus, the capacitance of an insulating layer formed between an upper wiring pattern and a lower wiring pattern is measured after the flattening processing has been completed, to calculate the layer thickness based on the measurement value.

However, when the thickness of an insulating layer formed on wiring patterns is measured by using the above methods, there are the following problems.

In the method using these conventional measuring apparatus (such as an optical film thickness measuring apparatus and a capacitance measuring apparatus), if the surface area of a wiring member (conductive layer) forming wiring patterns is relatively large, the thickness of an insulating film on the wiring patterns can be measured at relatively high precision. On the other hand, if the thickness of an insulating film on fine wiring patterns where the surface area of a wiring member (a conductive layer) forming wiring patterns are small or the width of the wiring member (conductive layer) is narrow, then a measurement error becomes large and the film thickness cannot be measured at high precision.

Therefore, it is difficult to precisely measure the thickness of an insulating layer on wiring patterns in a region a fine wiring pattern arranged in an isolated manner, that is, arranged with low density. Accordingly, it is impossible to measure the thickness difference between a region where fine wiring patterns are arranged with high density and a region where a fine wiring pattern is arranged in an isolated manner.

It has been desired to measure the thickness of an insulating layer formed on wiring patterns even in a region where a fine wiring pattern is isolated, that is, arranged with low density.

SUMMARY OF THE INVENTION

It is therefore an object of the present invention to provide a test pattern used for measuring the thickness of an insulating layer formed on wiring patterns.

It is another object of the present invention to provide test pattern used in measurement in which the thickness of an insulating layer formed on wiring patterns can be easily and precisely measured.

It is yet another object of the present invention to provide a test pattern for use in a measurement for easily and precisely measuring the thickness of an insulating layer formed on wiring patterns even in a region where a fine wiring pattern is isolated, that is, arranged with low density.

It is yet another object of the present invention to provide a test pattern for use in a measurement for precisely measuring the difference in the thickness of an insulating layer derived from the different density degree of wiring patterns.

Moreover, it is an object of the present invention to provide a method for measuring the thickness of an insulating layer formed on wiring patterns.

In addition, it is an object of the present invention to provide a method used for easily and precisely measuring the thickness of an insulating layer formed on wiring patterns.

Furthermore, it is an object of the present invention to provide a method used for precisely measuring the thickness of an insulating layer varying according to the density degree of the wiring patterns.

The present invention provides a test pattern for use in measuring the thickness of the insulating layer comprising: a wiring pattern provided in an insulating layer and having a resistance value depending on a thickness of the insulating layer; and a dummy pattern provided in the insulating layer adjacent to the wiring pattern and allowing the thickness of the insulating layer to be directly measured.

According to the test pattern of the present invention, it is possible to measure the resistance value of a certain wiring pattern provided in the insulating layer having a certain thickness. Therefore, by providing test patterns for a plurality of insulating layers having different thicknesses, respectively, and measuring the resistance value of each wiring pattern and the thickness of the insulating layer using the dummy pattern, it is possible to prepare a characteristic chart showing how the resistance value of a certain wiring pattern corresponds to the thickness of the insulating layer where the wiring pattern provided. It is possible to measure the thickness of an insulating layer indirectly by providing a wiring pattern in the insulating layer having a unknown thickness, measuring the resistance value thereof and applying the measured value to the characteristic chart above.

According to the present invention, it is preferable that the wiring pattern includes a through hole contact extending through the insulating layer and has a resistance value depending on the thickness of the insulating layer.

It is also preferable that the wiring pattern includes a lower wiring pattern arranged under the insulating layer and an upper wiring pattern arranged on the insulating layer; and the through hole contact connects the upper wiring pattern and the lower wiring pattern.

It is further preferable that the lower wiring pattern comprises a plurality of lower wiring parts linearly arranged at intervals; and a plurality of the through hole contacts are provided; and the plurality of through hole contacts connect the lower wiring parts and the upper wiring parts.

It is also preferable that the upper wiring parts are arranged to be partially overlapped with adjacent two the lower wiring parts in a vertical direction, respectively; and the through hole contacts connect the upper wiring parts and adjacent two the lower wiring parts positioned below the upper wiring parts, respectively.

It is preferable that the dummy pattern is arranged along the linearly arranged upper wiring pattern and lower wiring pattern.

In addition, it is preferable that the dummy pattern is arranged on both sides of the wiring pattern.

It is preferable that the dummy pattern comprises a lower dummy pattern part arranged under the insulating layer.

It is preferable that the dummy pattern allows the thickness of the insulating layer thereon to be optically measured.

It is preferable that the dummy pattern includes an upper dummy pattern part arranged on the insulating layer.

It is preferable that the dummy pattern allows the thickness of the insulating layer thereon to be capacitancially measured.

In another aspect of the present invention, there is provided a method for measuring the thickness of the insulating layer comprising the steps of: providing a test pattern comprising a wiring pattern provided in an insulating layer and having a resistance value depending on a thickness of the insulating layer and a dummy pattern provided adjacent to the wiring pattern and allowing the thickness of the insulating layer to be directly measured; conducting pre-measurement for providing a plurality of insulating layers having different thicknesses with the test pattern, respectively, measuring a resistance value of the wiring pattern for the plurality of insulating layers, respectively and directly measuring the thickness of the insulating layers by the dummy patterns; preparing a characteristic chart showing a relationship between the resistance value of the wiring pattern and the thickness of the insulating layer based on a measurement result of the pre-measurement; providing the wiring pattern in an insulating layer to be measured having an unknown thickness; conducting actual measurement for measuring a resistance value of the wiring pattern provided in the insulating layer to be measured; and applying the resistance value of the wiring pattern measured in the actual measurement to the characteristic chart and thereby directly measuring the unknown thickness of the insulating layer.

It is preferable that the wiring pattern includes a through hole contact extending through the insulating layer and has a resistance value depending on the thickness of the insulating layer by the through hole contact.

It is preferable that the wiring pattern comprises a lower wiring pattern arranged under the insulating layer and an upper wiring pattern arranged on the insulating layer; and the through hole contact connects the upper wiring pattern and the lower wiring pattern.

It is preferable that the lower wiring pattern comprises a plurality of lower wiring parts linearly arranged at intervals and the upper wiring pattern includes a plurality of upper wiring parts linearly arranged at intervals; the wiring pattern comprises a plurality of the through hole contacts; and the plurality of through hole contacts connect the lower wiring parts and the upper wiring parts.

It is preferable that the upper wiring parts are adjacent to be partially overlapped with adjacent two the lower wiring parts; and the through hole contacts connect the upper wiring parts and adjacent two lower wiring parts positioned under the upper wiring parts, respectively.

It is preferable that the dummy pattern is arranged along the linearly arranged upper wiring pattern and lower wiring pattern.

It is preferable that the dummy pattern is arranged on both sides of the wiring pattern.

It is preferable that the dummy pattern includes a lower dummy pattern arranged under the insulating layer.

It is preferable that the dummy pattern allows the thickness of the insulating layer thereon to be optically measured.

It is preferable that the dummy pattern includes an upper dummy pattern arranged on the insulating layer.

It is preferable that the dummy pattern allows the thickness of the insulating layer thereon to be capacitancially measured.

It is preferable that the main measurement is conducted using a plurality of wiring patterns arranged in parallel to one another at gradually changing intervals.

BRIEF DESCRIPTION OF THE DRAWINGS

The foregoing and the other objects, features and advantages of the present invention will be better understood from the following description taken in connection with accompanying drawings in which:

FIGS. 5(A) to 5(B) are a plan view and a cross-sectional view, for explaining yet another method for measuring a layer thickness according to the present invention.

DETAILED DESCRIPTION OF THE PREFERRED EMBODIMENTS

[First Embodiment]

Description will now be given to a test pattern for measuring the thickness of an insulating layer and a method for measuring the thickness of an insulating layer using the test pattern according to the present invention, with reference to FIGS. 1 and 3.

Figure 1A:
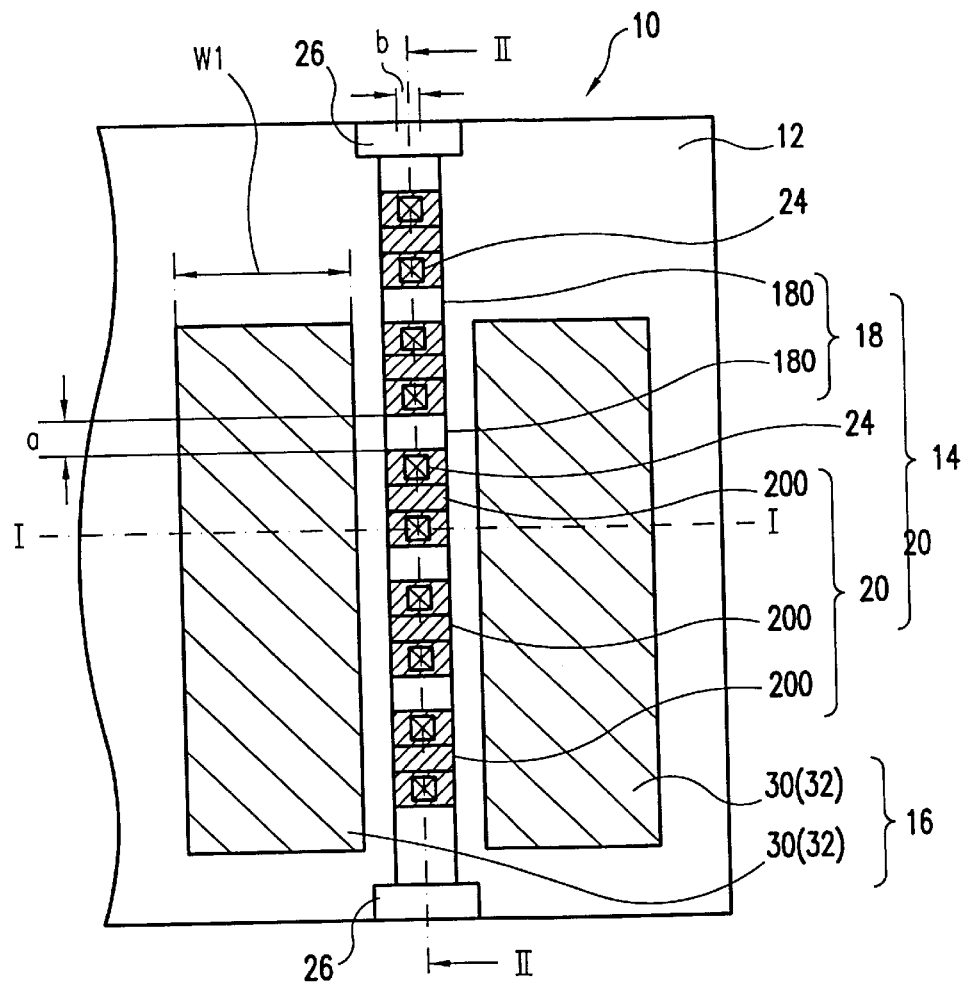
FIG. 1(A) is a plan view schematically showing the structure of a test pattern used in the pre-measurement of an insulating layer.
Figure 1B:
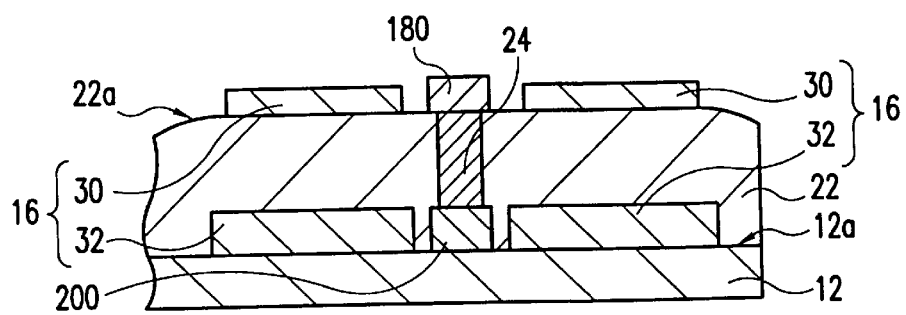
FIG. 1(B) is a cross-sectional view taken along lines I—I of FIG. 1(A)

An oblique line part shown in FIG. 1(A) is given not to illustrate a crosssection but to make clear a required region shown in FIG. 1(A). In FIG. 1(A), for purposes of making the drawing clear, a lower wiring part and a through hole contact are indicated by solid lines. However, the lower wiring part is provided on the rear surface of a first insulating layer and the through hole contact is provided in the lower portion of an upper wiring part.

A test pattern 10 is provided on a substrate 12. The test pattern 10 comprises a first wiring pattern 14 and a dummy pattern 16 arranged adjacent to the first wiring pattern 14 (FIGS. 1(A) to 1(C)). The test pattern 10 is used in the pre-measurement for preparing a characteristic chart showing the relationship between the thickness of an insulating layer and the resistance in the first wiring pattern 14.

The first wiring pattern 14 comprises an upper wiring pattern 18 and a lower wiring pattern 20. The lower wiring pattern 20 is provided directly on the upper surface 12a of the substrate 12. The upper wiring pattern 18 is provided on the upper surface 22a of a first insulating layer 22 provided on the lower wiring pattern 20 so as to face the lower wiring pattern 20 across the first insulating layer 22. More specifically, the upper wiring pattern 18 has a plurality of generally rectangular parallelepiped, island-shaped upper wiring parts 180 arranged linearly at predetermined intervals. The lower wiring pattern 20 has a plurality of generally rectangular parallelepiped, island-shaped lower wiring parts 200 arranged linearly at predetermined intervals. The lower wiring pattern parts 200 of the first wiring pattern 14 are so-called fine pattern parts. That is, when one of the parts 200 is provided in an isolated manner, the thickness of an insulating layer provided on the part 200 is difficult to measure by using the conventional method.

Figure 1C:
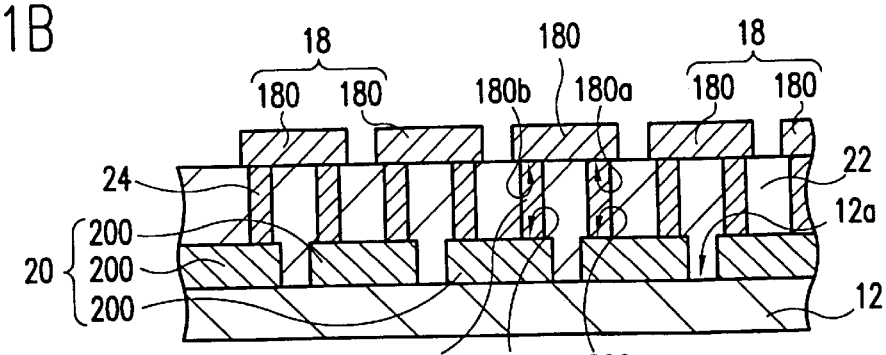
FIG. 1(C) shows part of the cross-section taken along line II—II of FIG. 1(A)

Each of the upper wiring pattern parts 180 is, if seen vertically, arranged to stretch over two adjacent lower wiring pattern parts 200, 200 (FIG. 1(C)). That is, the upper wiring pattern parts 180 are arranged such that one end 180a of the parts 180 are positioned on and partially overlapped with one end 200a of two ends 200a and 200b of two adjacent lower wiring pattern parts 200, 200, which face each other, and that the other end 180b of the parts 180 are positioned on and overlapped with the other end 200b of the ends 200a, 200b of two adjacent lower wiring pattern parts 200, 200, which face each other, respectively. In other words, the upper wiring pattern 18 and the lower wiring pattern 20 are arranged such that the each of ends 180a and 200a of respective wiring pattern parts 180, 200 are alternately arranged in the vertical direction.

The first wiring pattern 14 also comprises a first through hole contact 24. The first through hole contact 24 vertically extends through the first insulating layer 22 from the upper wiring pattern 18 to the lower wiring pattern 20. More specifically, the first through hole contact 24 connects the ends 180a, 180b of the upper wiring pattern parts 180 and ends 200a, 200b of the lower wiring pattern part 200 alternately overlapped with each other in vertical direction, respectively. The first through hole contact 24 has a structure in which a through hole passing through the first insulating layer 22 is formed between the first upper wiring pattern part 18 and the first lower wiring pattern 20 and conductive material is provided within the through hole. Therefore, the first through hole contact 24 has a length which is same as the thickness of the insulating layer 22 formed on the lower wiring pattern 20.

In the first wiring pattern 14 having the above-stated structure, ends of the upper and lower wiring pattern parts 180 and 200 overlapped with each other in the vertical direction are connected to each other by the first through hole contact 24 having the length which is the same as the thickness of the insulating layer 22. Therefore, the lower wiring pattern parts 200 and the upper wiring pattern parts 180, as a whole, form a such cross-section that the parts are sequentially connected in a "rectangular pulse" shape through the first through hole 24.

In this embodiment, the pitch distance a between the lower wiring pattern parts 200 is set approximately 2 $\mu$m and a length (width) k of the lower wiring pattern part 200 in a direction perpendicular to the arrangement direction is set approximately 1 $\mu$m.

In the test pattern 10, each of the upper wiring pattern parts 180 constituting the upper wiring pattern 18 have the same dimensions and shapes except for both ends and the same arrangement pitch. Likewise, in the test pattern 10, each of the lower wiring pattern parts 200 constituting the lower wiring pattern 20 have the same dimensions, shapes and arrangement pitch. However, wiring members should not be limited to the above structure. The upper wiring pattern parts 180 may have different dimensions and shapes. The lower wiring pattern parts 200 may have different dimensions and shapes as long as the thickness is the same.

Both ends of the first wiring pattern 14 terminates at the upper wiring pattern parts 180. Pads 26 are connected to the upper wiring pattern parts 180 on both ends of the first wiring pattern 14 to have a structure in which electric resistance generated in the first wiring pattern 14 can be measured.

A pair of dummy patterns 16 are arranged adjacent to the first wiring pattern 14. Each dummy pattern 16 comprises an upper dummy pattern part 30 and a lower dummy pattern part 32. The upper dummy pattern parts 30 are provided on the upper surface 22a of the first insulating layer 22 to be arranged adjacent to both sides of the linearly arranged upper wiring pattern 18. The lower dummy pattern parts 32 are provided on the upper surface of the substrate 12 to be adjacent to the both sides of a linearly arranged lower wiring pattern part 200 and to face the upper dummy pattern parts 30. The lower dummy pattern parts 32 have the same thickness as that of the lower wiring pattern part 200.

In this embodiment, the distance t0 between the lower wiring pattern 20 and the lower dummy pattern part 32 is set approximately 2 $\mu$m. Due to such a short distance between lower wiring pattern 20 and the lower dummy pattern part 32, the thickness of the insulating layer 22 on the lower wiring pattern 20 and that of the insulating layer 22 on the lower dummy pattern part 32 become almost same.

The length (width) W1 of the dummy pattern 16 in a direction perpendicular to the direction where the first wiring pattern 14 extends is set sufficiently longer than the width b of the first wiring pattern 10 so that thickness of the insulating layer on the dummy pattern 16 can be precisely measured by using the conventional measuring apparatus (such as an optical measuring apparatus and a capacitancially measuring apparatus).

The test pattern 10 having the above-stated structure is formed on the substrate 12 such as a silicon wafer by using a conventional technique such as a photo-lithography technique and an etching technique and so on. For example, a base is prepared by forming a lower wiring pattern part 20 and a lower dummy pattern part 32 both made of aluminum alloy on the substrate 12. Thereafter, an insulating layer 22 of silicon dioxide is formed on the base and etch back is conducted. Further, through holes constituting the through hole contact 24 are formed in predetermined positions in the insulating layer 22 and the through hole contact 24 is formed by providing aluminum alloy within the through hole. Finally, the upper wiring pattern part 18 and the upper dummy pattern 30 made of aluminum alloy are formed on predetermined positions on the upper surface 22a of the insulating layer 22. It is noted, however, that the method for forming the test pattern 10 as well as wiring material and the material of the insulating layer should not be limited to the above.

The test pattern 10 thus formed is used in the pre-measurement for preparing a characteristic chart showing the relationship between a layer thickness and resistance in the wiring pattern, as follows.

At first, a first pre-measurement is conducted. The thickness of the insulating layer 22 is measured using the test pattern 10. Specifically, using the conventional capacitance measuring apparatus, the thickness of the insulating layer 22 between the upper dummy pattern part 30 and the lower dummy pattern part 32 of the dummy pattern 16 is measured. As described above, the dummy pattern 16 putting the insulating layer 22 therebetween has a surface area such that a layer thickness can be measured precisely by using the conventional measuring apparatus (such as a capacitance measuring apparatus). This makes it possible to precisely and directly measure the thickness of the insulating layer 22 where the dummy pattern 16 is formed.

Next, electric resistance generated in the first wiring pattern 14 is measured. Specifically, electric resistance between the pads 26 provided on opposite ends of the first wiring pattern 14 is measured by using a resistance meter. The measured value of the electric resistance is divided by the number of through hole contacts provided in the first wiring pattern 14 and the resultant divided value is given as a resistance value per thorough hole contact. In this way, the resistance value per through hole contact in the wiring pattern formed in the insulating layer having a certain thickness is obtained. In this way, using the conventional measuring apparatus, it is possible to obtain the resistance value of a through hole contact with respect to a certain layer thickness measured by the conventional measuring apparatus.

Next, the second pre-measurement is conducted. Another test pattern 10 having the same structure as that of the above is provided in an insulating layer having a thickness different from that of the above insulating layer. Since the thickness of the insulating layer where another test pattern 10 is formed is different, the length of the through hole contact of the first wiring pattern 14 in the another test pattern 10 is different. However, the remaining dimensions and shape thereof are the same as those of the first wiring pattern 14 used in the previous pre-measurement. The electric resistance of the first wiring pattern 14 is therefore different from that obtained in the previous pre-measurement by an amount corresponding to a change in length of the through hole contact. Next, as in the same manner as the above, the thickness of the insulating layer 22 between the upper dummy pattern 30 and the lower dummy pattern 32 of the dummy pattern 16 is measured by using the conventional capacitancially measuring apparatus. Then, by measuring the electric resistance generated in the first wiring pattern 14, a resistance value per through hole contact is obtained.

Moreover, test patterns 10 are provided on a plurality of insulating layers having different thicknesses, respectively, and the layer thickness as well as the electric resistance of the first wiring pattern 14 are measured using the dummy pattern 16. Thereby, a resistance value per through hole contact for every layer thickness is calculated.

Figure 2:
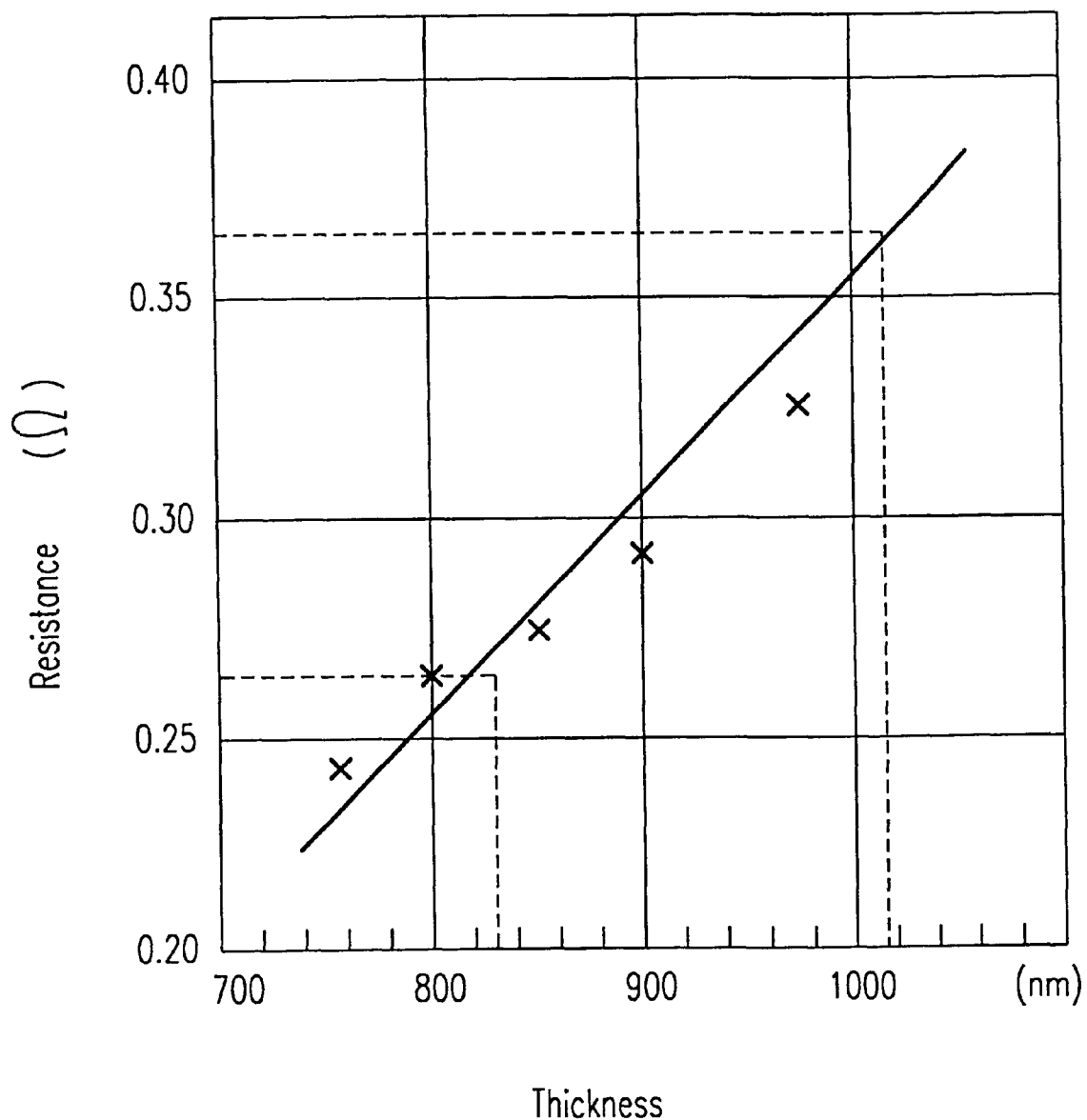
FIG. 2 is a T-R characteristic chart for actual thickness measurement of insulating layer given by using the test pattern of FIG. 1(A)

A T-R characteristic chart (FIG. 2) showing the relationship between the layer thickness and the resistance value of the through hole contact is prepared by plotting a resistance value per through hole contact thus obtained in a graph of FIG. 2. In FIG. 2, the axis of abscissas indicates the resistance value per through hole contact and the axis of ordinates indicates the thickness of an insulating layer.

As can be understood from FIG. 2, when the thickness of the insulating layer is 800 nm, the resistance value of the through hole contact is approximately 0.26 $\Omega$. When the thickness is 900 nm, the resistance value is approximately 0.29 $\Omega$. When the thickness is 960 nm, the resistance value is approximately 0.33 $\Omega$. Thus, it is seen that the resistance value per through hole contact almost linearly increases in proportion to the thickness of the insulating layer 22. Therefore, it is possible to approximate the relationship between the thickness of the insulating layer and the resistance value per through hole contact to a straight line indicated by a solid line shown in FIG. 2. In other words, the thickness of the insulating layer where the first wiring $\Omega\Omega\Omega$ pattern 14 is provided can be determined from the resistance value in the first wiring pattern 14.

To be specific, by measuring the resistance value of the first wiring pattern 14 provided in an insulating layer having an unknown thickness and applying the obtained resistance value to the above-stated characteristic chart, the thickness of the insulating layer can be indirectly measured.

Insulating layers having different thicknesses used for making a characteristic chart can be provided in different regions on a single substrate or on different substrates.

If the thickness of the insulating layer in the dummy pattern region may be optically measured, the upper dummy pattern part can be omitted from the dummy pattern.

Now, description will be given to the first embodiment of a method for measuring the thickness of an insulating layer using the characteristic chart made by using the test pattern 10.

Figure 3:
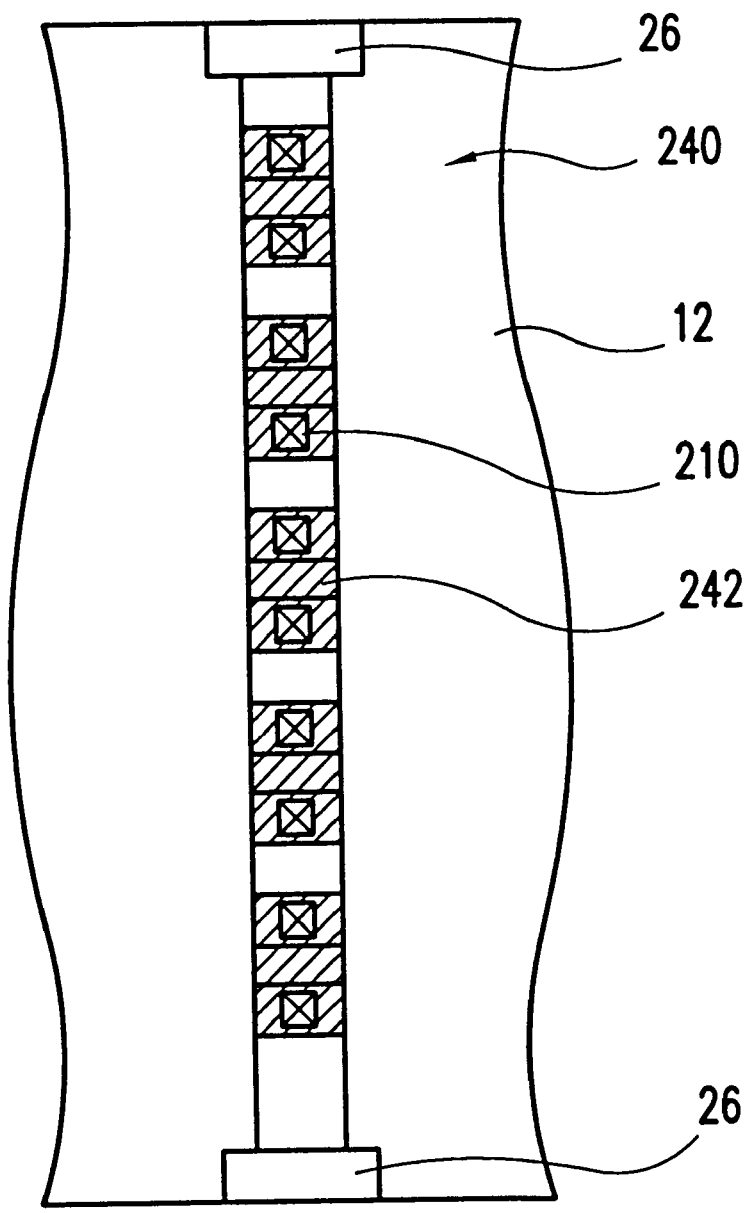
FIG. 3 is a plan view schematically showing the structure of a wiring pattern used in the actual measurement of the thickness of an insulating layer.

FIG. 3 is a schematic plan view of a second wiring pattern used in the actual measurement of the thickness of the insulating layer in this embodiment.

A second wiring pattern 240 is provided in an insulating layer the thickness of which is to be measured. The second wiring pattern 240 has exactly the same structure as that of the first wiring pattern 14 used in the pre-measurement except that the length of the through hole contact 210 depending on the thickness of the insulating layer. The electric resistance in the second wiring pattern 240 therefore varies, depending on the length of the through hole contact 210, that is, the thickness of the insulating layer where the second wiring pattern 240 is provided. Thus, by measuring the electric resistance generated in the second wiring pattern 240, the thickness of the insulating layer can be indirectly measured. The second wiring pattern 240 has exactly the same structure as that of the first wiring pattern 14 used in the pre-measurement except that the length of the through hole contact 210 varies in accordance with the thickness of the insulating layer to be measured, and therefore, no description will be therefore given.

If the unknown thickness of an insulating layer where the second wiring pattern 240 is provided is measured, a resistance value between pads 26, 26 provided on opposite ends of the second wiring pattern 240 is measured by using, for example, a resistance meter. The measurement value is divided by the number of through hole contacts. The obtained resistance value per through hole contact is applied to the above-stated characteristic chart (FIG. 2), thereby determining the thickness of the insulating layer where the second wiring pattern 240 is provided. For example, when the resistance value of the second wiring pattern 240 per through hole contact is 0.27 $\Omega$, the thickness of the layer is approximately 820 nm. When the resistance value is 0.36 $\Omega$, the thickness of the layer is approximately 1200 nm.

By using the above-stated measurement method, it is possible to measure the thickness of an insulating layer formed on a fine wiring pattern part arranged in an isolated manner which cannot be measured by the conventional method. As a result, even if the layer thickness on the isolated wiring part can be precisely measured.

[Second Embodiment]

Now, with reference to FIG. 4, description will be given to the second embodiment of a method for measuring a layer thickness using the characteristic chart (FIG. 2) made based on the test pattern 10.

Figure 4A:
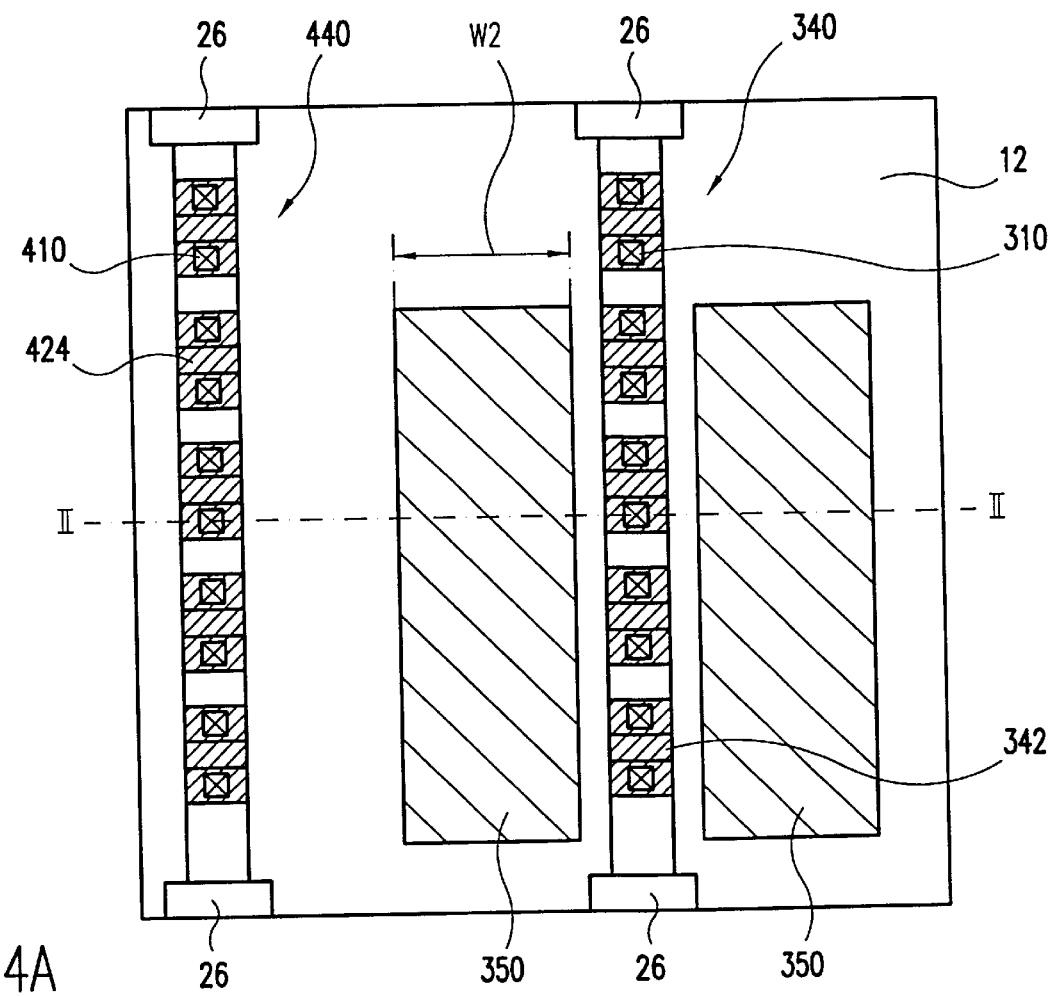
FIGS. 4(A) to 4(B) are a plan view and a cross-sectional view, for explaining another method for measuring a layer thickness according to the present invention.
Figure 4B:
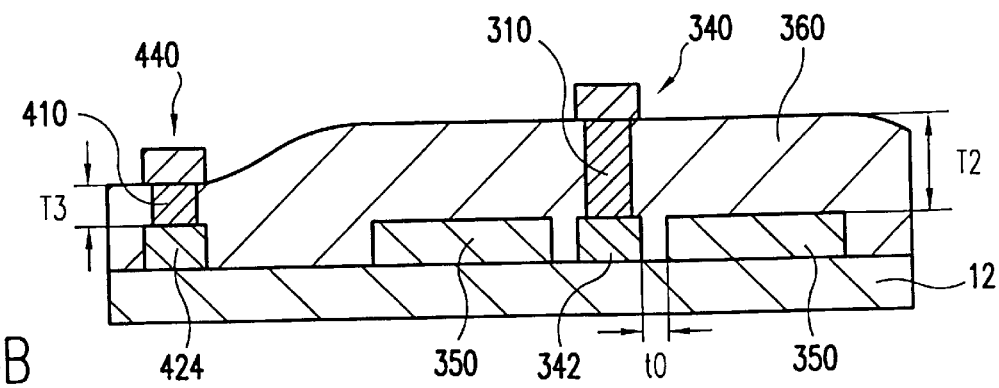

FIG. 4(A) is a plan view schematically showing the structure of a third wiring pattern use in the actual measurement for measuring a thickness of the insulating layer. FIG. 4(B) is a cross-sectional view taken along lines II—II of FIG. 4(A). An oblique line part shown in FIG. 4(A) is given not to illustrate the cross-section but to make clear a required region shown in FIG. 4(A).

In the second embodiment of method for measuring thickness of the insulating layer, a third wiring pattern 340 is provided on an insulating layer the thickness of which is to be measured as in the same manner as the pre-measurement. The third wiring pattern 340 has exactly the same structure as that of the first wiring pattern used in the pre-measurement except that the length of a though hole contact 310 varies depending on the thickness of the insulating layer in the measurement target. Therefore, as in the same manner as the pre-measurement, if measuring the electric resistance generated in the third wiring pattern 340, the thickness of the insulating layer can be indirectly measured. As mentioned above, since the third wiring pattern 340 has exactly the same structure as that of the first wiring pattern 14 used in the pre-measurement except that the length of the through hole contact 310 varies depending on the thickness of the insulating layer, description in target will not be given thereto.

Second dummy patterns 350 are provided adjacent to both sides of the linearly extending third wiring pattern 340. The second dummy patterns 350 are provided on the lower surface of the insulating layer 360 the thickness of which is to be measured. That is, the second dummy patterns 350 are arranged adjacent to the both sides of the lower wiring pattern part 342 of a third wiring pattern 340. The second dummy pattern 350 is the same in thickness as the lower wiring pattern part 342 of the third wiring pattern 340.

The length (width) W2 of the second dummy pattern 350 in a direction perpendicular to the direction where the third wiring pattern 340 extends is set larger than the width of the third wiring pattern 340. The length t0 between the second dummy pattern 350 and the lower wiring pattern part 342 of the third wiring pattern 340 is set approximately 2 $\mu$m. In this way, the second dummy pattern 350 having such a large area is arranged adjacent to both sides of the lower wiring pattern part 342 of the third wiring pattern 340. Therefore, an insulating layer having a thickness corresponding to a wiring patterns arranged with high density, is provided on the lower wiring pattern part 342 of the third wiring pattern 340.

Furthermore, in this embodiment, a fourth wiring pattern 440 is provided in a region of the insulating layer distant from the second dummy patterns 350. The fourth wiring pattern 440 has exactly the same structure as that of the first wiring pattern 14 used in the pre-measurement except that the length of a through hole contact varies depending on the thickness of the insulating layer. Therefore, as in the case of the pre-measurement, by measuring the electric resistance generated in the fourth wiring pattern 440, the thickness of the insulating layer where the fourth wiring pattern 440 is provided, can be measured indirectly. As stated above, since the fourth wiring pattern 440 has exactly the same structure as that of the first wiring pattern used in the pre-measurement except that the length of the through hole contact varies depending on the thickness of the insulating layer, description will not be given thereto.

The fourth wiring pattern 440 is provided distant from the second dummy patterns 350. Therefore, the insulating layer having a thickness corresponding to a case where a micro-processed wiring pattern is arranged in an isolated manner, is formed on the lower wiring pattern part 424 of the fourth wiring pattern 440.

In the second embodiment, resistance values of the third and fourth wiring patterns 340, 440 are measured, respectively and a resistance value per through hole contact for each of the wiring patterns 340 and 440 is calculated. Then, the thickness of the insulating layer is determined by using the characteristic chart of FIG. 2 from the calculated resistance value. As a result, the layer thickness (T2) corresponding to a region where wiring patterns are arranged with high density and the thickness of the layer (T3) corresponding to a region where an isolated fine wiring pattern is arranged, can be indirectly measured. If necessary, the two thicknesses can be compared.

[Third Embodiment]

With reference to FIG. 5, description will next be given the third embodiment of a method for measuring a layer thickness of the insulating layer using the characteristic chart (FIG. 2) made based on the test pattern 10.

FIG. 5(A) is a plan view schematically showing the arrangement of a fifth wiring pattern used in the third embodiment of the layer thickness measurement method. FIG. 5(B) is a cross-sectional view taken along lines II—II of FIG. 5(A). An oblique line part shown in FIG. 5(A) is given not to illustrate the cross-section but to make clear a required region shown in FIG. 5(A).

In the third embodiment of the method for measuring the thickness of the insulating layer, a plurality of wiring patterns 540, 640, 740, 840, 940, 1040, 1140 and 1240 are provided in an insulating layer the thickness of which is to be measured as in the case of the pre-measurement. The wiring patterns 540, 640, 740, 840, 940, 1040, 1140 and 1240 have exactly the same structures as that of the first wiring pattern 14 used in the pre-measurement except that lengths of through hole contacts vary depending on the thickness of the insulating layer. Therefore, as in the case of the pre-measurement, by measuring the electric resistance generated within the wiring patterns 540, 640, 740, 840, 940, 1040, 1140 and 1240, respectively, the layer thicknesses in the insulating layer where these wiring patterns are formed can be indirectly measured, respectively. As stated above, since the wiring patterns 540, 640, 740, 840, 940, 1040, 1140 and 1240 have exactly the same structures as that of the first wiring pattern 14 used in the pre-measurement except that lengths of through hole contacts vary (are different) according to the thickness of the insulating layer, description will not be given thereto.

In the third embodiment, the plural wiring patterns 540, 640, 740, 840, 940, 1040, 1140 and 1240 are arranged in parallel to one another.

In this embodiment, the insulating layer is arranged such that the plural wiring patterns 540, 640, 740, 840, 940, 1040, 1140 and 1240 are arranged at gradually longer intervals from the wiring pattern 540 on one end to the wiring pattern 1240 on the other end. For that reason, the insulating layer on one end where the wiring patterns are provided at shorter intervals is thicker than the insulating layer on the other end where the wiring patterns are provided at longer intervals. Thus, in the configuration shown in FIGS. 5(A) and 5(b), designating the thickness of the insulating layer at portions where the wiring patterns 540,640, 740, ,840, 940, 1040, 1140 and 1240 are provided with T1, T2, T3, T4, T5, T6, T7 and T8 respectively, T1–T8 are related such that T1>T2>T3>T4>T5>T6>T7>T8.

In the layer thickness measurement method in this embodiment, by measuring resistance values of the wiring patterns 540, 640, 740, 840, 940, 1040, 1140 and 1240, respectively and applying the obtained resistance values to the above-stated characteristic chart (FIG. 2), layer thicknesses of the respective regions of the insulating layer where the wiring patterns are formed can be obtained.

Such a layer thickness measurement method makes it possible to know the relationship between the interval of the wiring patterns and the thickness of the insulating layer. That is, the difference in thickness of the insulating layer derived from difference in the density degree of wiring patterns can be easily measured.

In the above-described measurement methods, it is possible to know how thick an insulating layer is formed on a fine wiring part (wiring pattern) arranged in an isolated manner under given layer formation conditions. Therefore, the data is utilized for design of the manufacturing process of a semiconductor device, thereby making use of an effective manufacturing process in a design phase. In addition, a wiring pattern for use in the actual measurement, for example, a second wiring pattern is formed on part of a wafer in a semiconductor device manufacturing step and the formed wiring pattern is used when evaluating the thickness of an insulating layer in the manufacturing phase.

In the above-described embodiments according to the present invention, wiring patterns having the same structures as that of the first wiring pattern except for the length of the through hole contact, are used as wiring patterns in the actual measurement such as a second wiring pattern. However, the present invention should not be limited to the embodiments. Wiring patterns used in the actual measurement can have any structure as long as resistance values except for those of through hole contacts are the same as that of the first wiring pattern and the resistance value of a through hole contact varies according to the thickness of the insulating layer as in the same manner as that of the first wiring pattern.

What is claimed is:

1. A test pattern for use in measuring thickness of an insulating layer comprising:

a plurality of wiring patterns provided in an insulating layer and arranged at unequal intervals, each of said wiring patterns having a resistance value depending on a thickness of the insulating layer, each of said wiring patterns including a lower wiring pattern arranged under said insulating layer and an upper wiring pattern arranged on said insulating layer; and at least one through hole contact extending through said insulating layer and having a resistance value depending on the thickness of said insulating layer for each of said wiring patterns, said through hole contact connecting said upper wiring pattern and said lower wiring pattern, wherein said plurality of wiring patterns constitute the test pattern for measuring thickness.

2. A test pattern for use in measuring thickness of insulating layer according to claim 1, wherein said lower wiring pattern includes a plurality of lower wiring parts linearly arranged at intervals; and said wiring pattern comprises a plurality of said through hole contact; and said plurality of through hole contacts connect said lower wiring parts and said upper wiring parts.

3. A test pattern for use in measuring thickness of insulating layer according to claim 2, wherein said upper wiring parts are arranged to be partially overlapped with adjacent two said lower wiring parts in a vertical direction, respectively; and said through hole contacts connect said upper wiring parts and adjacent two said lower wiring parts positioned below the upper wiring parts, respectively.

4. A test pattern for use in measuring thickness of insulating layer according to claim 3, further comprising a dummy pattern which is large enough to be used during direct measurement of thickness, wherein said dummy pattern is arranged along said linearly arranged upper wiring pattern and lower wiring pattern.

5. A test pattern for use in measuring thickness of insulating layer according to claim 3, further comprising a dummy pattern which is large enough to be used during direct measurement of thickness, wherein said dummy pattern is arranged on both sides of said wiring pattern.

6. A test pattern for use in measuring thickness of insulating layer according to claim 5, wherein said dummy pattern includes a lower dummy pattern part arranged under said insulating layer.

7. A test pattern for use in measuring thickness of insulating layer according to claim 6, wherein said dummy pattern allows the thickness of the insulating film thereon to be optically measured.

8. A test pattern for use in measuring thickness of insulating layer according to claim 6, wherein said dummy pattern includes an upper dummy pattern part arranged on said insulating layer.

9. A test pattern for use in measuring thickness of insulating layer according to claim 8, wherein said dummy pattern allows the thickness of the insulating layer to be capacitancially measured.

10. A method for measuring the thickness of an insulating layer comprising:

providing a test pattern comprising a test wiring pattern provided in an insulating layer and having a resistance value depending on a thickness of the insulating layer and a dummy pattern provided adjacent to the test wiring pattern said dummy pattern being large enough to allow the thickness of said insulating layer to be directly measured;

measuring a resistance value of said test wiring pattern for a plurality of insulating layers having varying thicknesses measuring the thickness of said plurality of insulating layers using said dummy patterns;

comparing measured resistance values with measured thickness to determine a relationship between the resistance value of said test wiring pattern and the thickness of said insulating layer;

providing an actual wiring pattern having a same structure as said test wiring pattern in an insulating layer to be measured having an unknown thickness;

measuring a resistance value of said actual wiring pattern provided in the insulating layer to be measured; and using the resistance value of said actual wiring pattern and the relationship between resistance values and thicknesses to determine the unknown thickness of the insulating layer.

11. A method for measuring the thickness of an insulating layer according to claim 10, wherein each of said test and actual wiring patterns include a through hole contact extending through said insulating layer and having a resistance value depending on the thickness of said insulating layer by the through hole contact.

12. A method for measuring the thickness of an insulating layer according to claim 11, wherein each of said test and actual wiring patterns comprise a lower wiring pattern arranged under said insulating layer and an upper wiring pattern arranged on said insulating layer; and said through hole contact connects said upper wiring pattern and said lower wiring pattern.

13. A method for measuring the thickness of an insulating layer according to claim 12, wherein said lower wiring pattern includes a plurality of lower wiring parts linearly arranged at intervals and said upper wiring pattern comprises a plurality of upper wiring parts linearly arranged at intervals;

said wiring pattern comprises a plurality of said through hole contact; and the plurality of through hole contacts connect said lower wiring parts and said upper wiring parts.

14. A method for measuring the thickness of an insulating layer according to claim 13, wherein said upper wiring parts are adjacent to be partially overlapped with adjacent two said lower wiring parts; and said through hole contacts connect said upper wiring parts and adjacent two lower wiring parts positioned under the upper wiring parts, respectively.

15. A method for measuring the thickness of an insulating layer according to claim 14, wherein said dummy pattern is arranged along said linearly arranged upper wiring pattern and lower wiring pattern of said test wiring pattern.

16. A method for measuring the thickness of an insulating layer according to claim 14, wherein said actual wiring pattern includes a plurality of wiring patterns having a same structure as said test wiring pattern arranged in parallel to one another and being spaced apart at gradually changing intervals.

17. A method for measuring the thickness of an insulating layer according to claim 14, wherein said dummy pattern is arranged on both sides of said test wiring pattern.

18. A method for measuring the thickness of an insulating layer according to claim 17, wherein said dummy pattern comprises a lower dummy pattern arranged under said insulating layer.

19. A method for measuring the thickness of an insulating layer according to claim 18, wherein said dummy pattern allows the thickness of the insulating layer thereon to be optically measured.

20. A method for measuring the thickness of an insulating layer according to claim 19, wherein said dummy pattern comprises pattern comprises an upper dummy pattern comprises an upper dummy pattern arranged on said insulating layer.

21. A method for measuring the thickness of an insulating layer according to claim 20, wherein said dummy pattern allows the thickness of the insulating layer thereon to be capacitancially measured.

* * * * *